United States Patent
Pietri et al.

(10) Patent No.: US 9,658,294 B2
(45) Date of Patent: May 23, 2017

(54) TESTING A SWITCHED MODE SUPPLY WITH WAVEFORM GENERATOR AND CAPTURE CHANNEL

(75) Inventors: Stefano Pietri, Austin, TX (US); Chris C. Dao, Pflugerville, TX (US); Garrin S. Felber, Austin, TX (US)

(73) Assignee: NXP USA, INC., Austin, TX (US)

( * ) Notice: Subject to any disclaimer, the term of this patent is extended or adjusted under 35 U.S.C. 154(b) by 1601 days.

(21) Appl. No.: 13/289,671

(22) Filed: Nov. 4, 2011

(65) Prior Publication Data

US 2013/0113449 A1 May 9, 2013

(51) Int. Cl.
- *G01R 21/00* (2006.01)
- *G01R 31/40* (2014.01)
- *H02M 3/156* (2006.01)

(52) U.S. Cl.
CPC .......... *G01R 31/40* (2013.01); *H02M 3/156* (2013.01)

(58) Field of Classification Search
CPC .................................................... H02M 3/156
USPC ........................................................ 702/60
See application file for complete search history.

(56) References Cited

U.S. PATENT DOCUMENTS

| | | | |
|---|---|---|---|
| 4,451,782 A * | 5/1984 | Ashida | G01R 27/28 324/76.26 |
| 5,742,494 A | 4/1998 | Brakus et al. | |
| 6,281,650 B1 | 8/2001 | Yutkowitz | |
| 6,825,641 B2 | 11/2004 | Pigott | |
| 7,586,767 B1 * | 9/2009 | Prodic et al. | 363/65 |
| 7,622,820 B1 * | 11/2009 | Prodic et al. | 307/31 |
| 7,633,277 B1 | 12/2009 | Jacoby | |
| 7,710,705 B2 | 5/2010 | Balakrishnan et al. | |
| 7,804,283 B2 | 9/2010 | Krellner et al. | |
| 7,859,239 B2 | 12/2010 | Yamada | |
| 7,880,447 B1 | 2/2011 | Lin et al. | |
| 8,077,490 B1 * | 12/2011 | Prodic et al. | 363/65 |
| 2008/0191677 A1 | 8/2008 | Bacchi et al. | |
| 2009/0013199 A1 * | 1/2009 | Leung | H02M 3/157 713/300 |
| 2009/0079401 A1 * | 3/2009 | Mok et al. | 323/234 |
| 2009/0091897 A1 | 4/2009 | Willing et al. | |
| 2009/0174366 A1 | 7/2009 | Ahmad et al. | |
| 2009/0267582 A1 * | 10/2009 | Prodic | H02M 3/157 323/283 |
| 2009/0309567 A1 * | 12/2009 | Morroni | H02M 3/157 323/283 |
| 2010/0127681 A1 * | 5/2010 | Kenly | G01R 27/28 323/282 |
| 2010/0237838 A1 * | 9/2010 | Templeton | 323/271 |
| 2010/0245143 A1 | 9/2010 | Stanley et al. | |
| 2011/0037524 A1 | 2/2011 | Dao et al. | |

(Continued)

OTHER PUBLICATIONS

Freescale Semiconductor, Inc., Implementing a Digital AC/DC Switched-Mode Power Supply Using a 56F8300 Digital Signal Controller, Application Note AN3115, Rev. 0, Aug. 2005.

(Continued)

*Primary Examiner* — Ricky Ngon (57) ABSTRACT

A test method and system are provided for testing a switched mode power supply in open loop on an automated test equipment device by applying a low frequency waveform signal (209) to a compensator filter (225) and simultaneously capturing and processing the input (223) and output (222) to the compensator filter (225) to determine the phase difference therebetween.

20 Claims, 6 Drawing Sheets

(56) References Cited

U.S. PATENT DOCUMENTS

| | | |
|---|---|---|
| 2011/0169078 A1 | 7/2011 | Yang et al. |
| 2011/0181264 A1 | 7/2011 | Aiura |
| 2011/0185212 A1 | 7/2011 | Dao et al. |
| 2013/0076119 A1* | 3/2013 | Yogeeswaran et al. .......... 307/3 |
| 2013/0134951 A1* | 5/2013 | Kelly ................... H02M 3/156 323/273 |

OTHER PUBLICATIONS

Rahman, Muhammad Saad, Buck Converter Design Issues, Thesis No. LiTH-ISY-EX—06/3854—SE, Jul. 17, 2007.

Microchip Technology Incorporated, WebSeminars, Buck Converter Design Example, 2006.

Hagen, Mark et al., Applying Digital Technology to PWM Control-Loop Designs, focus.ti.com/download/trng/docs/seminar/Topic_7_Hagen.pdf, downloaded Sep. 6, 2011.

* cited by examiner

TESTING A SWITCHED MODE SUPPLY WITH WAVEFORM GENERATOR AND CAPTURE CHANNEL

BACKGROUND OF THE INVENTION

Field of the Invention

The present invention is directed in general to power supplies. In one aspect, the present invention relates to test circuit for a switched mode power supply controller.

Description of the Related Art

Figure 1:
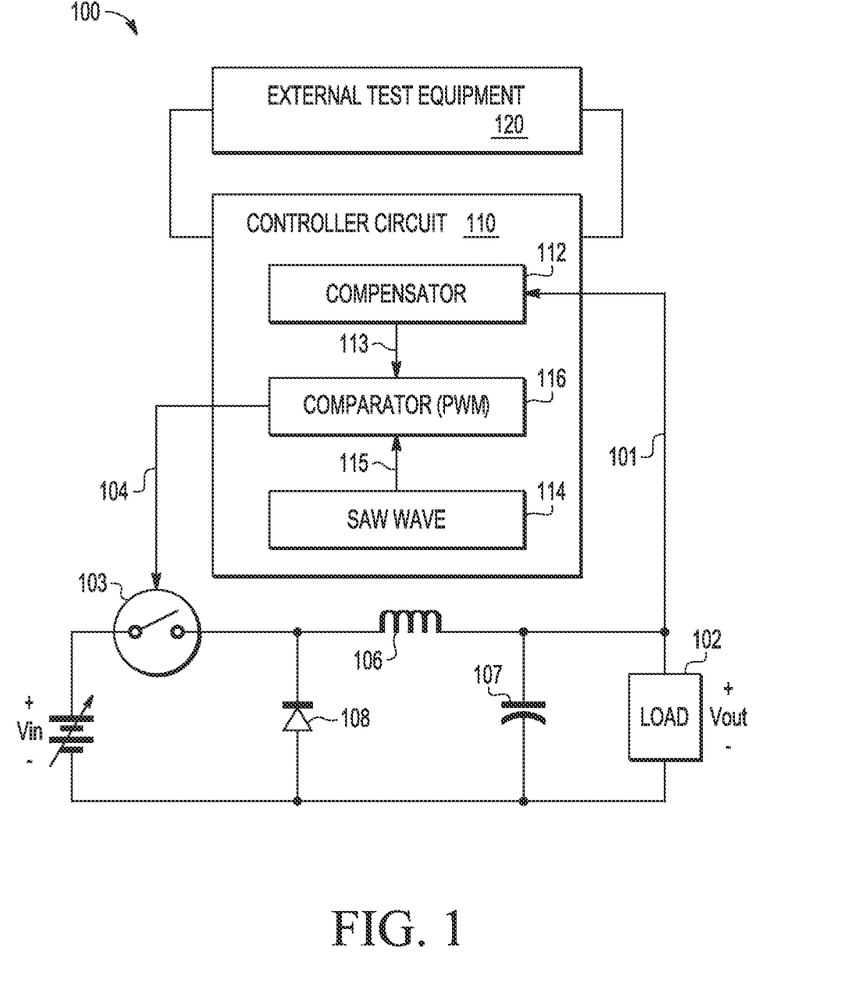
FIG. 1 is a simplified schematic circuit diagram illustrating a conventional switched mode power supply and with external test equipment.

In switched-mode power supplies (SMPS), a switching regulator is used to efficiently convert an input voltage to a desired output voltage. Typically, a switching regulator includes a DC/DC controller and a power section with drivers. There are several kind of switching regulators, including boost converters, buck converters, and buck and boost converters. The control circuitry may have voltage mode feedback or current mode feedback, and may use different types of compensation to generate the duty cycles for the power section. FIG. 1 is a simplified circuit diagram illustrating a switched mode power supply 100 which includes an input voltage Vin, an output voltage Vout, a controller circuit 110, and a buck-type DC/DC converter which converts an input voltage Vin to an output voltage Vout at a regulated value over the entire range of Vin, where Vin is greater than Vout.

While there are a variety of designs that are suitable for implementing DC/DC converters, the depicted buck-type DC/DC converter is constructed with passive filtering components, including an inductor 106 coupled between a capacitor 107 and rectifier 108. In addition, a controller unit 110 applies a gating pulse width modulation (PWM) signal 104 to a switch 103 which couples the input voltage Yin across the capacitor 107 and rectifier 108 to charge the inductor 106, thereby generating an output voltage Vout across the load 102. The depicted controller unit 110 includes a compensator 112, a saw wave generator 114, and a comparator 116. Due to the double complex pole introduced by the LC elements 106, 107, the compensator 112 generates a compensated error feedback signal 113 by introducing gain and phase lead to the feedback Vout signal 101 for achieving loop stability, improved bandwidth, and high DC gain. The saw wave generator 114 generates a saw wave clock signal 115 which is supplied to the comparator 116. The comparator 116 compares the compensated error feedback signal 113 and saw wave clock signal 115 to generate a pulse width modulation (PWM) signal 104 which drives the switch 103.

Further limitations and disadvantages of conventional technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

An automated test equipment system and methodology are provided for testing an analog or digital compensator filter in the digital controller for a switched mode power supply (SMPS) using only a digital capture circuit and general-purpose tester resources, thereby minimizing the tester configuration so as to reduce test time, increase parallelism, and decrease test equipment costs. In selected embodiments, the automated test equipment system and methodology apply a DC voltage sufficiently close to the target regulated voltage and superimpose a test waveform signal to the main Vdd supply of the SMPS under test, thereby generating a compensator filter input signal. Simultaneously, the compensator filter input and output are captured with signal capture circuits for processing to determine the phase difference across the compensator filter. The test waveform signal can be a low frequency sinusoid with frequency in the order of the LC tank resonating frequency, or some complex waveform. In selected embodiments, the test waveform signal may be AC-coupled to the Vdd supply pin with capacitor connected to an external waveform source, usually at frequency lower than the switching regulator controller clock. At the same time, the output from the compensator filter and the input at the Vdd supply pin are captured using a digital capture circuit, and the resultant waveforms are processed to determine the phase lead introduced by the compensator filter. By implementing the digital capture circuit as a comparator which removes high frequency noise and signal information and provides one-bit precision against a threshold voltage, the digital capture circuit may be used to digitally capture the output of an analog or digital compensator filter. With the disclosed automated test equipment system and methodology, the compensator filter in a switched mode power supply may be tested structurally in an open loop on automated test equipment. In addition, the disclosed automated test equipment system and methodology may be implemented separately from the power supply product and used for quality testing at manufacture, or may be included with the SMPS products and used for field testing and diagnostics.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming,} it would nevertheless be a routine undertaking for those of ordinary skill in the art having the benefit of this disclosure. For example, selected aspects are shown in simplified schematic diagram form, rather than in detail, in order to avoid limiting or obscuring the present invention. Such descriptions and representations are used by those skilled in the art to describe and convey the substance of their work to others skilled in the art. Various illustrative embodiments of the present invention will now be described in detail below with reference to the figures.

Conventional approaches for testing switched mode power supplies typically use external test hardware 120 with active components to implement a full ballast circuit with LC tank feedback. For example, one technique for testing the compensator 112 in the controller 110 is to provide an input signal to the compensator 112 and calculate the FFT at the output. Despite the apparent simplicity of the technique, it requires advanced test equipment with a high resolution/high bandwidth analog-to digital-converter and an FFT calculation. Unfortunately, these features are not readily available in standard, low cost testers for standard microcontrollers. In addition, harsh testing conditions (e.g., in automotive applications) can limit the use of active components on tester boards, and ballast circuits can limit parallelism and cause increased test time due to settling, etc. Moreover, the complex componentry in external tester hardware 120 can lead to reduced test quality caused by faulty or out-of-spec external components and drift over temperature of these components. The complexity of external test hardware 120 also imposes increased costs and scarcity, especially when advanced features are required in the test hardware, such as high speed analog to digital channels.

Figure 2:
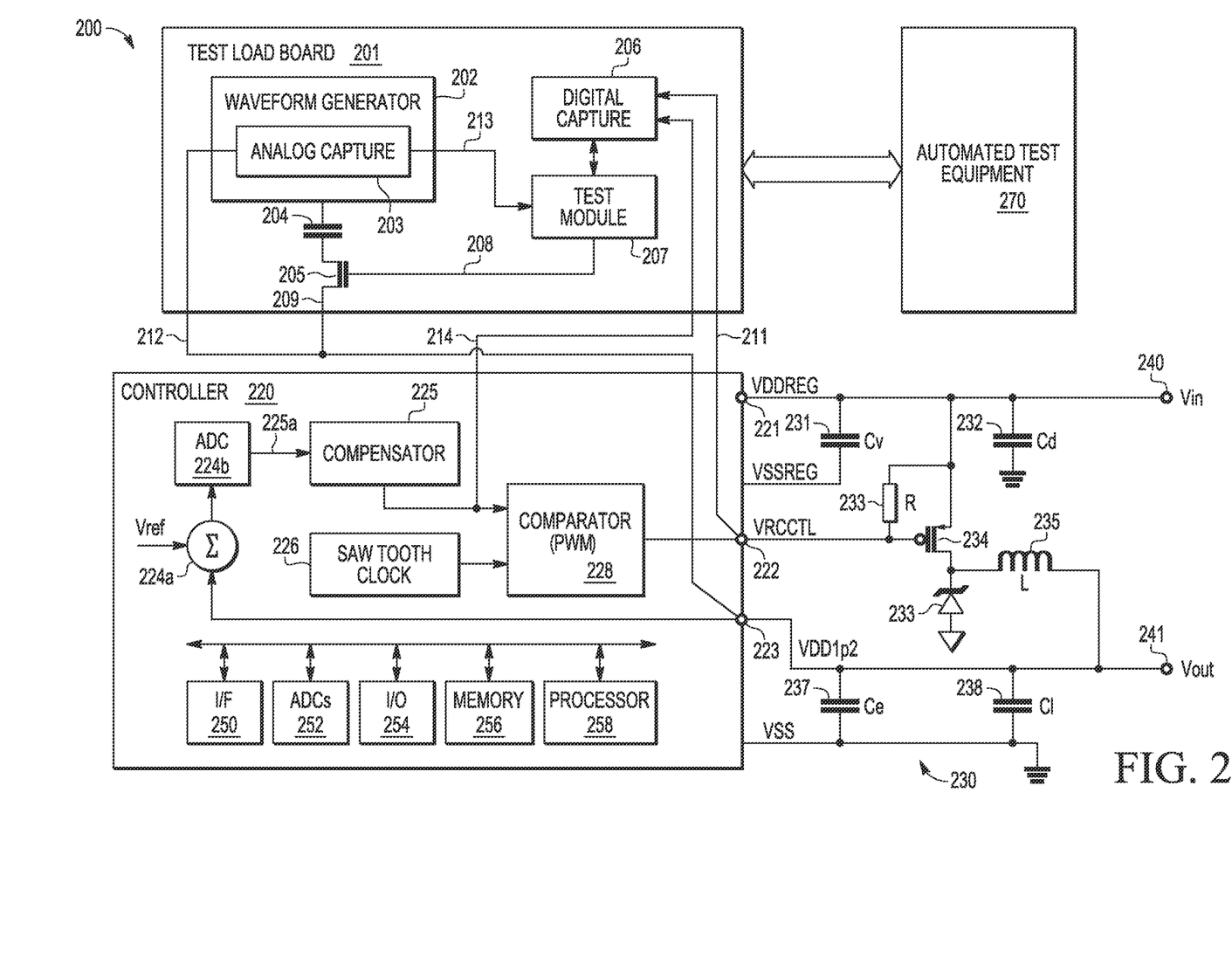
FIG. 2 is a simplified schematic circuit diagram illustrating an automated test equipment device for testing a switched mode power supply in accordance with selected embodiments of the invention.

Turning now to FIG. 2, there is depicted a simplified schematic circuit diagram 200 illustrating a test load board device 201 for testing a switched mode power supply (SMPS) in accordance with selected embodiments of the invention. The depicted power supply is a digitally controlled SMPS which includes a controller unit 220 and DC/DC converter 230.

The depicted controller 220 may be implemented with a digital signal controller (DSC) or microcontroller unit (MCU) or any other controller to provide many advantages over mixed analog- and processor-controlled implementations. These include programmability, adaptability, reduced component count, design reusability, process independence, advanced calibration ability, and better performance. By using full digital control, the SMPS system becomes flexible and can also realize complex control arithmetic that improves efficiency and lowers cost. A controller-based SMPS system integrates high-performance digital signal processing with power electronics, providing a new method for design of power electronics, and the typical high-level control and communication capability an SMPS system requires.

The depicted DC/DC converter 230 includes an input voltage (Vin) at the input supply pin 240, an output voltage (Vout) at the Vdd supply pin 241, and a buck converter circuit 230, though other types of converter circuits (e.g., boost or buck/boost circuits) can be used. The input node 240 is tied to inputs 221 of both the controller 220 and the buck circuit 230, while the output node 241 is tied to an output of the buck circuit 230 and to a feedback input 223 of the controller 220. When an input voltage Vin is applied to the input node 240, the DC/DC converter 230 is operable to generate an output voltage Vout at the output node 241. For many, if not all, applications, it is desirable to maintain Vout at a regulated value over the entire range of Vin. However, it will be appreciated that other types of converters and/or configurations may be used in other embodiments.

In the DC/DC converter 230, a voltage source (not shown) provides an input DC voltage Vin to the input node 240 which is connected a source electrode of a switch transistor 234. The switch transistor 234 is shown as a PMOS transistor having agate electrode and a drain electrode, though NMOS switch transistors may be used with the appropriate correction of signal polarities. The switch transistor 234 is connected at its drain electrode to a cathode terminal of a diode 236 (e.g., Schottky diode) which has its anode terminal grounded. The drain electrode of the switch transistor 234 is also connected across inductor 235 to the output node 241. The inductor 235 is also connected to one or more additional load capacitors 237, 238, each of which is grounded at the opposite electrode. An output voltage Vout is developed at an output node 241 at a junction connecting the inductor 235 and the additional load capacitor(s) 237, 238.

With continued advances in CMOS and VLSI technology, the controller 220 may be implemented as a high-performance, practical, cost-effective, and low-power digital SMPS controller which includes a communication interface block 250, general-purpose ADCs (ADCs) 252, digital I/Os 254, memory 256; and a processing unit 258 that handles programming, communication, diagnostics, power management, etc. As will be appreciated, one or more of the identified components 250-258 are used to provide the requisite controller functionality described herein. The resulting digital controller 220 may be configured to regulate the output voltage, perform complex sequencing and monitor key parameters (e.g., average current and power output). In addition, the controller 220 may use a digital filter compensator 225 to programmably compensate the error voltage with a non-linear response function. In other embodiments, the controller 220 may use an analog or digital filter that introduces either a phase shift or a gain or both to the filter input signal to compensate for the error signal introduced during the feedback of the output voltage Vout. As will be appreciated, the required number of poles and zeros in the digital compensator filter 225 depends on the application. For a buck regulator circuit 230, a proportional, integral, derivative (PID) compensator 225 may be used to provide two zeros to compensate for the second-order plant (power stage) and a pole at the origin is needed to minimize steady-state error. However, other analog or digital filter approaches may be used for the compensator 225.

In operation, an input voltage Vin (e.g., reference voltage VDD) at the input node 240 is received at the input 221 (VDDREG) of the controller 220, and is operable to generate a buck driving signal (VRCCTL) at output 222 that is applied to the gate electrode of the switch transistor 234 to drive the buck circuit 230. In selected exemplary embodiments, the controller 220 includes control logic for generating the buck driving signal (VRCCTL) as an output square wave drive waveform having controlled duty cycles. There are three specific blocks that enable the controller 220 to achieve the high-performance regulation requirements of the buck circuit 230—namely, the saw tooth clock generator 226 (and associated clock input signal) used to generate the reference level, the digital compensator filter 225 that compensates the error feedback signal, and the digital pulse width modulator (PWM) comparator 228 that converts the compensated error feedback signal into the buck driving signal (VRCCTL).

Under control of the buck driving signal VRCCTL, electrical energy from the input voltage Vin at the input node 240 is transferred to the load at the output node 241 by repetitive pulsing provided by the switching of the switch transistor 234 caused by application of the buck driving signal VRCCTL. Excess energy delivered from the input voltage Vin is stored and unloaded in the reactive components, namely the inductor 235 and the one or more additional load capacitors 237, 238. At the same time, constant power is maintained in the load at the output node 241, producing a stepped down voltage Vout at the output node 241. The output voltage Vout is fed back to the controller 220 via feedback input 223 for comparison to a reference voltage value Vref at the comparison circuit 224a, with the result being converted to digital form by the error ADC 224b and then provided as an input to the compensator filter 225.

One of the challenges with using controllers is to provide a practical way to test the controller components using basic tester resources and minimal test hardware requirements. In particular, it may be a relatively trivial matter to test the functionality of the saw tooth clock 226 and comparator 228, but conventional approaches for testing compensator filters provide an input signal to the compensator and then use analog capture circuits (not shown) to capture the compensator filter inputs and outputs for use in calculating the FFT at the output. As will be appreciated, these approaches require advanced test equipment with high resolution/high bandwidth analog-to-digital converter circuits and FFT calculation processing, feature not always available or at least limited in standard (low cost) testers for standard microcontrollers.

In embodiments of the invention described herein, a production test scheme and methodology are provided which uses only digital capture circuits and general purpose tester resources to test the compensator filter 225. To this end, a test load board device 201 is disclosed which provides an interface between the automatic test equipment (ATE) 270 and the device under test (DUT) (namely, the compensator filter 225). The disclosed test load board 201 is used to set up the DUT 225 for correct testing by the ATE 270, to route the test and response signals between the DUT 225 and the ATE 270, and to provide additional test capabilities that the ATE 270 may not be able to provide. As will be appreciated, the test board functionality described herein may also be included in the ATE device 270.

As shown in FIG. 2, the test load board 201 includes a waveform generator circuit or module 202 connected across a switching capacitor (e.g., coupling capacitor 204 and switching transistor 205) for generating an output waveform signal 209. In selected embodiments, the waveform generator 202 may be physically located inside the ATE 270 which generates the actual waveform that is routed out of the ATE 270 through the tester load board 201. In any case, the waveform generator 202 may be implemented as a hardware circuit that is controlled by software. The software may be included as part of the test software/module 207 which downloads parameters to the hardware to configure it to generate the waveform.

The test load board 201 may also include an analog capture circuit or module 203 and/or digital capture circuit/module 206 which are controlled by a test software/module 207 as described herein. The analog capture module or circuit 203 may be included as part of the waveform generator 202 as a low resolution analog-to-digital converter for capturing the signal generated by the waveform generator 202 that is ultimately applied to the input to the compensator filter 225. In similar fashion, the digital capture block 206 may be provided as a circuit on the Test Load Board 201 for capturing the test output signal 214 from the compensator filter 225. Though not expressly shown, an analog compensator filter output may be piped out to an analog test pin through a test multiplexer so that it can be captured. In selected embodiments, the digital capture block 206 may be implemented as a comparator which removes high frequency noise and signal information and provides one-bit precision against a threshold voltage so as to digitally capture the output of an analog or digital compensator filter.

In testing mode, the waveform generator 202 applies a waveform signal across a coupling capacitor 204 to the output voltage supply pin 223 of the controller 220. In selected embodiments, the waveform generator 202 generates a low frequency AC waveform 209, such as a sinusoidal waveform signal having a controlled frequency (e.g., 40 kHz in an example test case), though it will be appreciated that the frequency of the waveform may be programmatically controlled. In selected embodiments, the frequency of the periodic waveform 209 is selected to approximate the resonant frequency of the switched mode regulator LC tank. Using a connection signal 208 generated by the test software/module 207, the waveform generator 202 is AC coupled onto the main VDD supply 223 of the controller 220 to create a waveform overlaid on a predetermined DC voltage that may be supplied by the ATE 270 to the Vdd supply pin 223, thereby generating a test input signal at the sense line input 225a to the compensator 225.

In addition to setting up the compensator filter 225 in the proper test mode and switching in the waveform generator 202, the test software/module 207 is configured to capture the input to the compensator filter 225 using either analog or digital capture techniques. In selected embodiments, the analog capture circuit 203 effectively measures the input to the filter 225 at signal input 212 by selectively capturing the output waveform signal 209 generated by the waveform generator 202. Since the output waveform signal 209 is applied across the switched capacitor circuit 204, 205 and feedback input 223 (and any intervening circuit elements 224a, b) to the input to the compensator filter 225, the captured signal information 213 from the analog capture block 203 represents the input to the compensator filter 225. The captured signal information 213 is provided to the test software/module 207 for processing as described herein under control of software instructions, processor(s) and/or other controller functionality.

The test software/module 207 may also be configured to capture the output from the compensator filter 225 via test output signal 214 using a digital channel capture circuit 206 which provides a comparator function to remove high frequency noise and signal information and generate a one-bit comparison against a threshold voltage to digitally capture the output of an analog or digital compensator filter. Whether located in the test load board 201 or in the ATE 270, the digital channel capture circuit 206 may be controlled by software to generate a first output (e.g., logical '0') when the input signal (e.g., the compensator output) is below the threshold voltage, and to generate a second output (e.g., logical '1') when the input signal is above the threshold. As will be appreciated, the digital channel capture circuit 206 may record the compensator output at regular intervals, and is a circuit feature that is included in most modern testers as part of the digital system. In operation, the test module 207 controls the timing of the compensator output capture at the digital capture channel 206 so as to coincide with the AC coupling of the waveform source 202 to the VDD output pin 223. In addition, the test module 207 synchronizes the capture of the compensator input capture at feedback input 223 by the analog capture module or circuit 203. Thus, the test module 207 is configured to start the capture of feedback input 223 and the output of the compensator filter 225 simultaneously.

In addition to controlling the simultaneous application of the waveform 209 to the feedback input 223 for the compensator 225 with the capture of the input and output for the compensator 225, the test module 207 is configured to process the resultant waveforms to determine the phase lead introduced by the compensator filter 225. In selected embodiments, the processing involves passing the compensator filter output (e.g., square wave) and the analog capture of the compensator filter input through an FFT transform module. The phase value at the appropriate FFT bin is compared to describe the phase difference across the compensation filter 225. For example, the test module 207 simultaneously couples a low frequency waveform 209 into the feedback input 223/VDD output supply pin 241 across switching transistor 205 to create a waveform (40 kHz in the test case) overlaid on the SMPS sense line input 223. At the same time, the test module 207 uses a digital channel capture circuit 206 to capture the output from the compensator filter 225 at output 222 (via test output signal 211), and uses an analog capture module 203 to capture the input to the compensator filter 225 measured at the voltage supply pin VDD 241 (via test output signal 214). While the analog capture module 203 in the test load board 201 may be used to capture the filter input, it will be appreciated that the power supply resource's own analog capture facility (not shown) may be used to capture the filter input. However implemented, both the input and output captures are begun simultaneously. By performing an FFT on both captures, the test module 207 calculates the phase difference between the input and output of the integrating filter to determine correct functionality.

Figure 3:
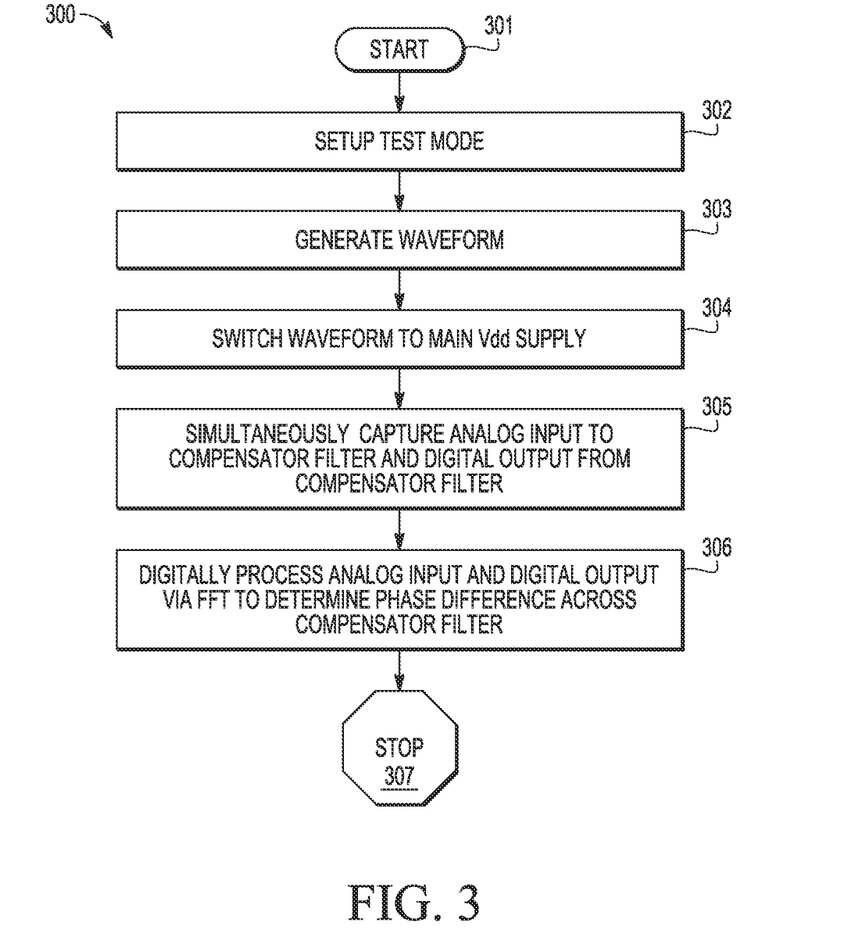
FIG. 3 shows an example process flow for testing a switched mode supply with low frequency waveform generator and digital capture channel in accordance with selected embodiments of the present invention.

In accordance with various embodiments of the present invention, an improved testing scheme is provided for testing a switched mode power supply in open loop by selectively applying a low frequency waveform to the main VDD output pin as an input of the compensator filter where it is captured along with the resulting output from the compensator filter for processing to determine the phase lead generated by the compensator filter. While details of the test methodology vary from one embodiment to another, FIG. 3 shows an example process flow 300 for testing a switched mode power supply with low frequency waveform generator and digital capture channel. Though selected embodiments of the test sequence are illustrated in FIG. 3, it will be appreciated that the sequence of illustrated steps may be modified, reduced or augmented in keeping with the disclosure of the present invention. For example, one or more of the steps may optionally be included, excluded, combined, or substituted. Thus, it will be appreciated that the methodology of the present invention may be thought of as performing the identified sequence of steps in the order depicted in FIG. 3, though the steps may also be performed in parallel, in a different order, or as independent operations that are combined.

As depicted, the methodology begins at step 301, and a test mode is set up for the device under test at step 302. For example, a simple test pattern is applied to find the max and min output range of the test output for purposes of computing an approximate peak-peak voltage (VPP), and the digital comparator voltage is then set to VPP/2. In addition, the test load board 201 and/or ATE 270 may be connected to the controller 220 so that the waveform generator 202 is switched across the coupling capacitor 204 and switch transistor 205 to the VDD output pin as an input of the compensator filter 225. Finally, the capture modules or circuits 203, 206 may be initialized by the test module 207.

At step 303, a waveform is generated at the test load board 201 and/or ATE 270. In an example test case, the waveform is generated as a low frequency (e.g., 40 kHz) sinusoidal waveform by waveform generator 202. The waveform generator may be included as part of the automated test equipment, but the waveform generator may also be separately provided. Under control of the test software, the frequency of the generated waveform may be selected and changed to generate one or more waveforms for use in the test procedure described herein.

At step 304, the waveform is switched onto the compensator filter input under control of the test software. The switching may use a switching capacitor 204 and/or switch transistor 205 to AC couple the waveform 209 onto the feedback input 223/VDD output supply pin 241 in response to a connection signal 208. As the main Vdd output pin is also an input to the compensator filter 225, the waveform creates a waveform that is overlaid on the compensator filter input.

As the waveform is applied to the compensator filter input, the analog input and digital output from the compensator filter are simultaneously captured at step 305. The simultaneous capture may be controlled and actuated by test software associated with the automated test equipment. To begin the capture process, the switched mode power supply is first powered up by applying an input voltage (e.g., at Vin 240) and enabling the switched mode power supply. In addition, one or more sub-circuit tests may be performed prior to the analog capture and digital capture process. To enable analog capture, the positive input to the compensator filter is connected directly or indirectly to the VDD output pin (e.g., Vout 241) so that there is AC coupling from the waveform generator 202 to the positive input of the compensator 225. To find the comparator trip point, the SMPS circuit is configured to provide clocking on the VRCCTRL pin 222 by connecting the reference voltage to the negative input of the compensator 225 and searching the VDD voltage level to find the switch point for the comparator 228. The comparator switch point search is initiated by applying VDD voltage to the Vout pin 241 and varying its voltage using simple linear search or binary search, until clocking is observed on VRCCTRL pin 222. At this point, the VDD voltage is held at the Vout pin 241. Next, the waveform generator 202 is turned on to apply a sine waveform onto coupling capacitor 204. At this point, with both the analog signal superimposed on the feedback input 223/VDD output supply pin 241 and a clock present at VRCCTRL, the analog capture and digital capture can be started. In selected embodiments, the analog capture circuit/block 203 in the tester hardware 201 is used to digitize the sinewave waveform 209 that is applied to the feedback input 223/VDD output supply pin 241, though other analog capture circuits can be used.

At step 306, the captured analog input to the compensator filter (e.g., at the Vdd output pin) and the digital output from the compensator filter are processed to determine the phase difference introduced by the compensator filter. In selected embodiments, the processing may be implemented with test software associated with the automated test equipment which performs a FFT on both captures and calculates the phase difference between the input and output of the integrating filter to determine the phase difference across the filter. At step 307, the process ends.

Figure 4A:
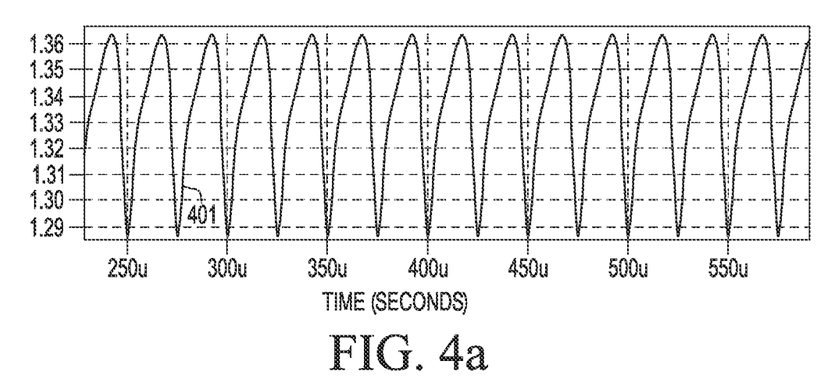
FIGS. 4a-c show tester capture waveforms at a compensator filter input collected with an analog tester.
Figure 4B:
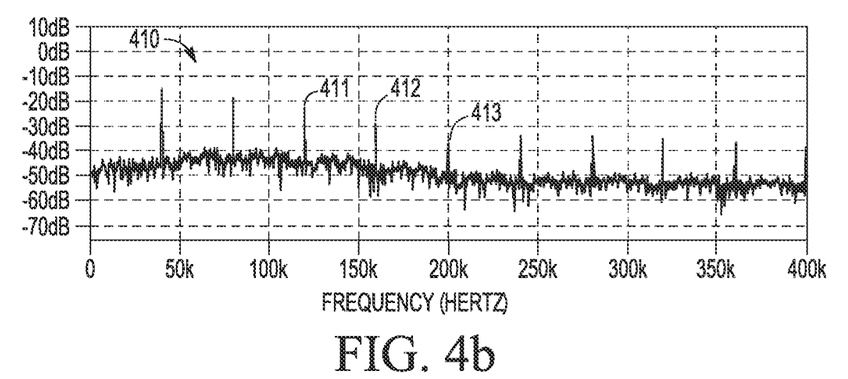
Figure 4C:
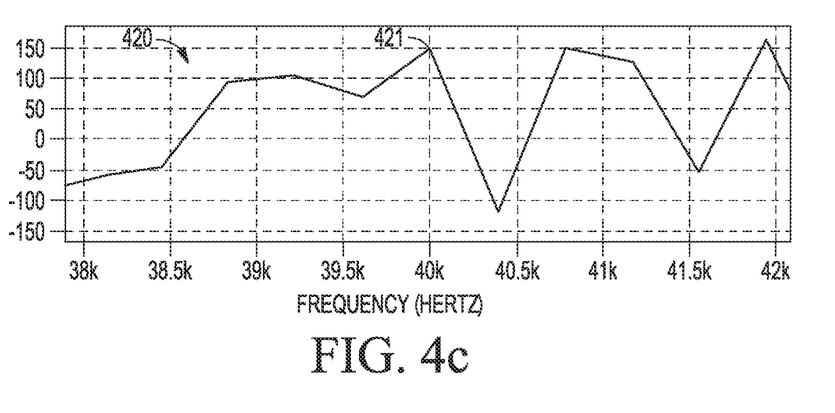

In the disclosed filter test methodology, the filter inputs and outputs are simultaneously captured and then processed by performing a complex FFT computation to extract amplitude (aka, magnitude) and phase signal information. To illustrate the capture of the input to the compensator filter in accordance with selected embodiments, reference is now made to FIGS. 4a-c which show tester capture waveforms at a compensator filter input collected with an analog tester. In the depicted example waveforms, FIG. 4a depicts an example analog waveform 401 over time that is applied as an input to the compensator filter during a filter test operation. With reference to the example embodiment shown in FIG. 2, the analog waveform 401 would be the output waveform signal 209 generated by the waveform generator 202 and applied directly or indirectly an input to compensator 225 as a sinewave superimposed on top of the feedback input 223/VDD output supply pin 241. The analog waveform 401 is captured by the analog capture block 203 in the test load board 201 or an equivalent capture functionality included in the test load board 201 or controller 220. In support of the compensator filter test operations, a complex FFT is performed on the analog waveform 401 to extract the magnitude and phase for the input to the compensator filter. For example, FIG. 4b depicts the magnitude FFT waveform 410 that is computed from the captured analog waveform 401, and FIG. 4c depicts the phase FFT waveform 420 that is computed from the captured analog waveform 401 (e.g., the phase values on the compensator filter input at the 40.0 kHz frequency). In the magnitude FFT waveform 410, the depicted dB v. frequency waveform shows the constituent frequencies at pulses 411-413 corresponding to 40 kHz intervals (e.g., 120 kHz, 160 kHz and 200 kHz), In the phase FFT waveform 420 shown in FIG. 4c, the depicted phase v. frequency waveform shows the signal phase information 421 at 40 kHz. As will be appreciated, the FFT computations may be performed by the test module 207 in the test load board 201, in the controller 220, or in the ATE 270.

Figure 5A:
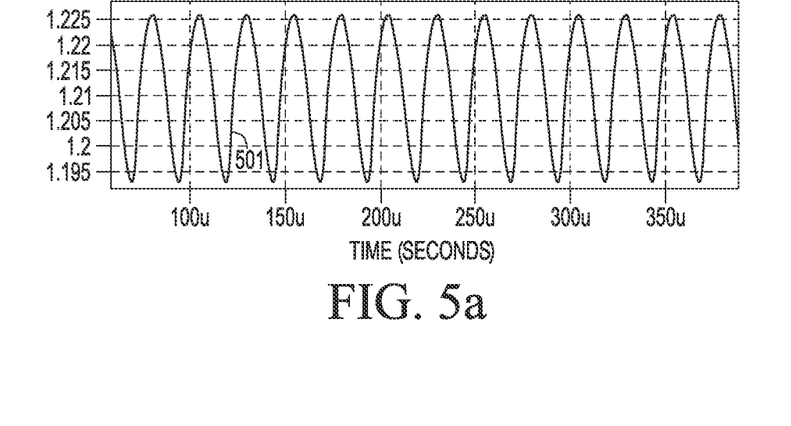
FIGS. 5a-c show tester capture waveforms at a compensator filter output collected with an analog tester.
Figure 5B:
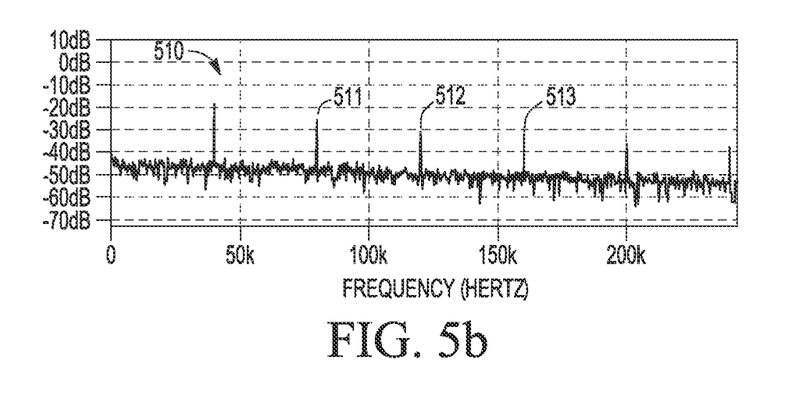
Figure 5C:
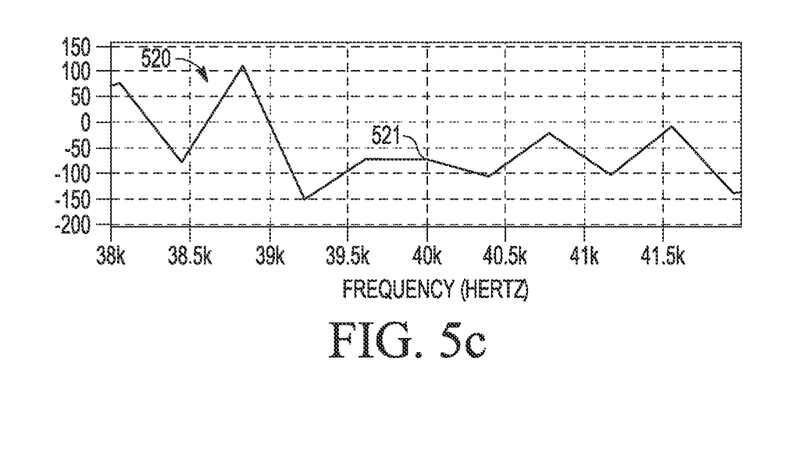

To illustrate the capture of the output to the compensator filter, reference is now made to FIGS. 5a-c which show tester capture waveforms 501, 510, 520 at a compensator, filter output collected with an analog tester. The depicted waveforms 501, 510, 520 are provided to demonstrate the operability of the present disclosure by providing a reference point for comparison to the digitally captured filter output signal information described below with reference to FIGS. 6a-c. In the depicted example waveforms, FIG. 5a depicts an example analog waveform 501 that is captured with an analog capture circuit (not shown) to show the output from the compensator filter (e.g., via. test output signal 214) in response to the analog waveform 401 being applied as a filter input. By performing a complex FFT on the filter output analog waveform 501, the magnitude and phase for the compensator filter output may be extracted. Thus, FIG. 5b depicts the magnitude FFT waveform 510 that is computed from the output analog waveform 501 captured at the filter output, and FIG. 5c depicts the phase FFT waveform 520 that is computed from the output analog waveform 501 captured at the filter output. In the magnitude FFT waveform 510, the depicted dB v. frequency waveform shows the constituent frequencies at pulses 511-513 corresponding to 40 kHz intervals (e.g., 80 kHz, 120 kHz and 160 kHz). In the phase FFT waveform 520, the depicted phase v. frequency waveform shows the signal phase information 521 extracted at 40 kHz.

Figure 6A:
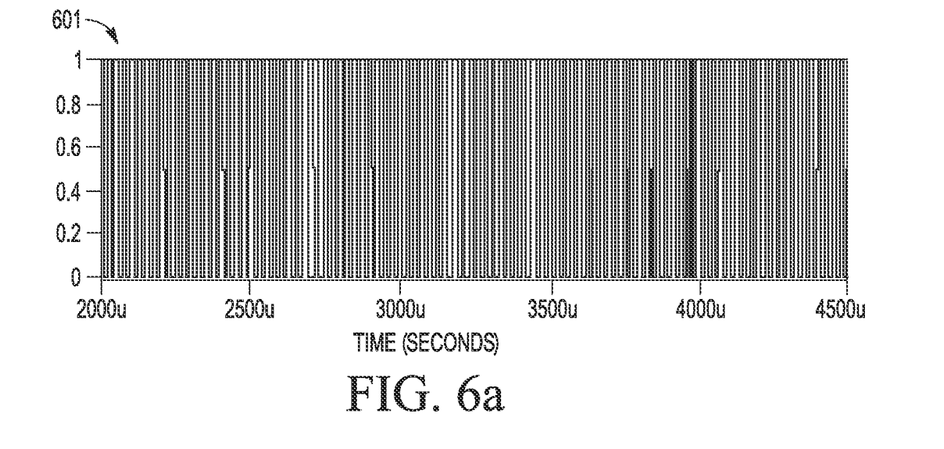
FIGS. 6a-c show tester capture waveforms at a compensator filter output collected with a digital automatic test equipment tester in accordance with selected embodiments of the present invention.
Figure 6B:
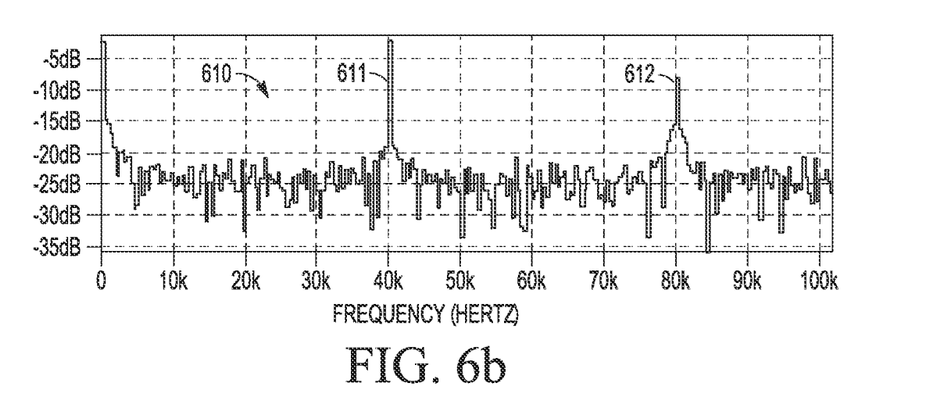
Figure 6C:
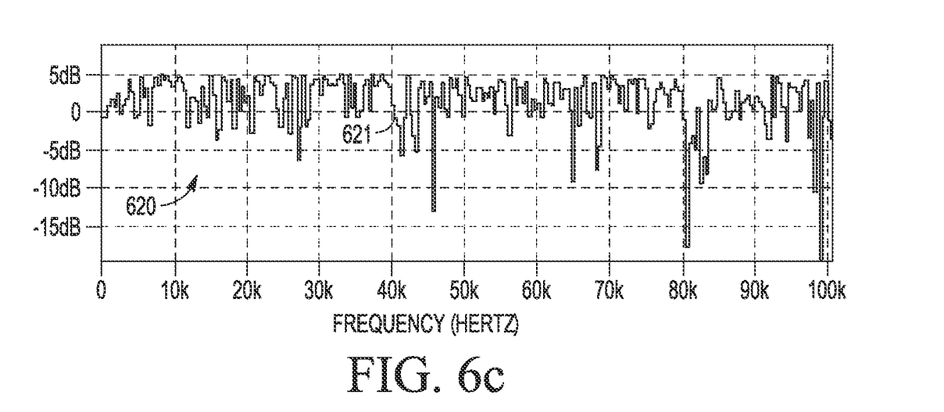

In accordance with selected embodiments, FIGS. 6a-c show tester capture waveforms 601, 610, 620 at the compensator filter output that are collected with a digital capture block of the automatic test equipment tester disclosed herein. In FIG. 6a, the digital waveform 601 is captured as an output from the compensator filter (e.g., via test output signal 214) in response to the analog waveform 401 being applied as a filter input. As depicted, the x-axis is time and the y-axis indicates whether a 1 or 0 was captured, and the plot indicates that 16384 bits were captured over approximately 2.5 milliseconds. The digital waveform 601 is captured by the digital channel capture block 206 in the test load board 201 or an equivalent capture functionality included in the test load board 201 or controller 220. In support of the compensator filter test operations, a complex FFT is performed on the digital filter output waveform 601 to extract the magnitude and phase for the output to the compensator filter. For example, FIG. 6b depicts the magnitude FFT waveform 610 that is computed from the captured digital filter output waveform 601, and FIG. 6c depicts the phase FFT waveform 620 that is computed in radians from the captured digital filter output waveform 601 (e.g., the phase values on the compensator filter output at the 40.0 kHz frequency). In the magnitude FFT waveform 610, the depicted dB v. frequency waveform shows the constituent frequencies at pulses 611, 612 corresponding to 40 kHz and 80 kHz. In the phase FFT waveform 620 shown in FIG. 6c, the depicted dB v. frequency waveform shows the signal phase information extracted at 40 kHz. As will be appreciated, the phase FFT waveform 620 shown in FIG. 6c can be converted to degrees by multiplying a phase value in radians) times 360 degrees/2π radians. Also, the FFT computations may be performed by the test module 207 in the test load board 201, in the controller 220, or in the ATE 270.

Based on the captured filter input and output values, the test module 207 evaluates the filter performance by computing the gain and phase shift. The gain of the compensator at the frequency of interest (40 kHz in this case) may be computed as the ratio of the magnitude of output signal to that of the input signal. The phase shift is computed as the phase difference between the output signal and the input signal. For example, the variables "vddPhase" and "pmcPhase" may be computed as the extracted phase FFT waveform values at the compensator filter input and output, respectively. After converting the extracted phase values from radians to degrees, the extracted phase values may be used to calculate the final phase shift variable "phasedelta" with the following instructions:

'If pmcPhase<0 Then pmcPhase=pmcPhase+360
'If vddPhase<0 Then vddPhase=vddPhase+360
phasedelta=vddPhase−pmcPhase
If phasedelta<0 Then phasedelta=phasedelta+360.

By now it should be appreciated that there is provided herein a methodology for testing a compensator filter in a controller for a power supply by calculating the magnitude and phase of the control section of the SMPS using a simple waveform generator and a comparator to test the compensator filter in the control loop to determine if the compensator filter satisfies the requirements for achieving stability once used in the real application. The power supply may be a switched mode power supply with a digital controller and a buck converter circuit for receiving an input voltage and generating an output voltage that is fed back through the digital controller to the compensator filter. In the disclosed methodology, a waveform signal is applied to generate a filter input signal at an input of the compensator filter, such as by superimposing the waveform signal on a predetermined DC voltage that is applied to a Vdd supply pin to generate the filter input signal. In selected embodiments, the waveform signal is applied as a low frequency test signal to a coupling capacitor that is operably coupled across a switching transistor to the input of the compensator filter. Simultaneously, the compensator filter's input signal and output signal are captured. In selected embodiments, the filter input signal is captured using an analog capture unit (e.g., a low resolution ADC) to capture the waveform signal that is applied to generate the filter input signal, while in other embodiments, the filter input signal is captured using a digital channel capture unit to capture the waveform signal that is applied to generate the filter input signal. In any case, the output of the compensator filter is captured using a digital channel capture unit which digitally captures the filter output signal with a comparator circuit. Thereafter, a phase change value for the compensator filter is computed by extracting frequency response values from the simultaneously captured filter input signal and filter output signal. For example, amplitude and/or phase response values may be extracted from the simultaneously captured filter input signal and filter output signal, and the phase change value may be computed by computing a phase difference between the phase response values. With this approach, the compensator filter may be tested structurally in an open loop on automated test equipment.

In another form, there is provided a system and associated methodology for testing a switched mode power supply (SMPS). As disclosed, the test system includes a waveform signal generator coupled to provide a low frequency periodic waveform signal on a Vdd supply pin of the switched mode power supply. To assist with applying the waveform signal to the Vdd supply pin, a switched coupling capacitor may be connected between the waveform signal generator and the Vdd supply pin in response to a first connection signal generated by the test capture unit. The test system also includes a digital capture unit coupled to capture a test output of a compensator filter in the switched mode power supply, and an analog capture unit (e.g., a low resolution analog-to-digital converter) coupled to capture a test input of the compensator filter in the switched mode power supply. In addition, the test system includes a test capture unit for controlling the digital capture unit and analog capture unit to simultaneously capture and process the test output and test input of the compensator filter to compute a phase difference value for the compensator filter. An FFT module in the test capture unit performs an FFT on the test input and output to extract magnitude and phase information for the test input and output of the compensator filter. In selected embodiments, the test capture unit computes the phase difference value by extracting amplitude and phase response values from the simultaneously captured test output and test input of the compensator filter. The test capture unit also superimposes the low frequency waveform signal on a predetermined DC voltage that may be supplied by the ATE 270 to the Vdd supply pin (e.g., feedback input 223/VDD output supply pin 241) while the test output and test input of the compensator filter are simultaneously captured.

In another form, there is provided a test load board apparatus and methodology for testing a compensator filter in a digital controller for a power supply. As disclosed, the test load board includes a waveform generator for generating a waveform signal that is AC-coupled to apply a test input signal to an input of the compensator filter. The test load board also includes an analog capture module (e.g., a low resolution analog-to-digital converter) for capturing the test input signal in response to a first capture signal, and a digital capture module (e.g., a digital capture tester channel) for simultaneously capturing a test output signal at an output of the compensator filter in response to a second capture signal. In addition, the test load board includes a test software module for controlling the first and second capture signals to simultaneously capture the test input and test output signals and performing a fast Fourier transform (FFT) on the test input and test output signals to extract magnitude and phase information for the test input and test output signals for the compensator filter. In operation, the test software module uses the extracted phase information for the test input and test output signals to compute a phase difference value for the compensator filter.

Although the described exemplary embodiments disclosed herein are directed to an automated test equipment configuration and associated method of operation in which a low frequency waveform signal is applied to the VDD supply pin of a compensator filter so that the inputs and outputs from the compensator filter may be simultaneously captured and processed to determine a phase lead parameter introduced by the compensator filter, the present invention is not necessarily limited to the example embodiments which illustrate inventive aspects of the present invention that are applicable to a wide variety of test circuits. Thus, the particular embodiments disclosed above are illustrative and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for testing a compensator filter in a controller for a power supply comprising:
   applying a waveform signal to generate a filter input signal at an input of the compensator filter of the controller for the power supply;
   capturing the filter input signal at the input of the compensator filter and simultaneously capturing a filter output signal from the compensator filter; and
   computing a phase change value between the filter input and output signals for the compensator filter by extracting frequency response values from the simultaneously captured filter input and output signals.

2. The method of claim 1, where applying the waveform signal comprises applying a low frequency test signal to a coupling capacitor that is operably coupled across a switching transistor to the input of the compensator filter.

3. The method of claim 1, where capturing the filter input signal comprises using an analog capture unit to capture the waveform signal that is applied to generate the filter input signal.

4. The method of claim 3, where the analog capture unit comprises a low resolution analog-to-digital converter for capturing the waveform signal.

5. The method of claim 1, where capturing the filter output signal comprises digitally capturing the filter output signal with a comparator circuit.

6. The method of claim 1, where the controller comprises a voltage controller for a DC/DC converter.

7. The method of claim 1, where the power supply comprises a switched mode power supply comprising a digital controller and buck converter circuit for receiving an input voltage and generating an output voltage that is fed back through the digital controller to the compensator filter.

8. The method of claim 1, where computing the phase change value comprises extracting amplitude and phase response values from the simultaneously captured filter input signal and filter output signal.

9. The method of claim 1, where computing the phase change value comprises extracting phase response values from the simultaneously captured filter input signal and filter output signal and computing a phase difference between the phase response values.

10. The method of claim 1, where applying the waveform signal to generate the filter input signal comprises superimposing the waveform signal on a predetermined DC voltage that is applied to a Vdd supply pin to generate the filter input signal.

11. The method of claim 1, where the compensator filter introduces a phase shift and/or a gain to the filter input signal to compensate for an error signal being supplied to the compensator filter.

12. The method of claim 1, where the compensator filter is tested structurally in an open loop on automated test equipment.

13. A system for testing a switched mode power supply (SMPS), comprising:
a waveform signal generator coupled to provide a periodic waveform signal on a Vdd supply pin of the switched mode power supply;
a digital capture unit coupled to capture a test output of a compensator filter in the switched mode power supply;
an analog capture unit coupled to capture a test input of the compensator filter in the switched mode power supply; and
a test capture unit for controlling the digital capture unit and analog capture unit to simultaneously capture and process the test output and test input of the compensator filter to compute a phase difference value between the test input and test output for the compensator filter.

14. The system of claim 13, further comprising a switched coupling capacitor connected between the waveform signal generator and the Vdd supply pin in response to a first connection signal generated by the test capture unit.

15. The system of claim 13, where the analog capture unit comprises a low resolution analog-to-digital converter for capturing the periodic waveform signal.

16. The system of claim 13, where the switched mode power supply comprises a buck converter circuit for receiving an input voltage and generating an output voltage that is fed back to the compensator filter.

17. The system of claim 13, where the test capture unit comprises a fast Fourier transform (FFT) module for processing the test input by performing an FFT on the test input to extract magnitude and phase information for the test input of the compensator filter.

18. The system of claim 13, where the test capture unit comprises a fast Fourier transform (FFT) module for processing the test output by performing an FFT on the test output to extract magnitude and phase information for the test output of the compensator filter.

19. The system of claim 13, where the test capture unit computes the phase difference value by extracting amplitude and phase response values from the simultaneously captured test output and test input of the compensator filter.

20. A test load board apparatus for testing a compensator filter in a digital controller for a power supply comprising:
a waveform generator for generating a waveform signal that is AC-coupled to apply a test input signal to an input of the compensator filter;
an analog capture module for capturing the test input signal in response to a first capture signal;
a digital capture module for simultaneously capturing a test output signal at an output of the compensator filter in response to a second capture signal; and
test module for controlling the first and second capture signals to simultaneously capture the test input and test output signals and compute a phase change value between the test input and test output signals by performing a fast Fourier transform on the test input and test output signals to extract magnitude and phase information for the test input and test output signals for the compensator filter.

* * * * *